United States Patent [19]
Chen

[11] Patent Number: 5,880,539
[45] Date of Patent: Mar. 9, 1999

[54] ELECTROMAGNET INDUCED SWITCH

[75] Inventor: Rich Chen, Taipei, Taiwan

[73] Assignee: Silitek Corporation, Taipei, Taiwan

[21] Appl. No.: 831,707

[22] Filed: Apr. 10, 1997

Related U.S. Application Data

[63] Continuation-in-part of Ser. No. 759,639, Dec. 5, 1996.
[51] Int. Cl.$^6$ ..................................................... G08C 21/00
[52] U.S. Cl. ......................... 307/119; 395/309; 361/139; 345/168; 341/22; 364/189
[58] Field of Search ................................... 307/119, 116; 395/309; 361/139; 345/173, 168; 341/23, 22; 235/61 PE; 364/189

[56] References Cited

U.S. PATENT DOCUMENTS

| | | | |
|---|---|---|---|
| 5,450,078 | 9/1995 | Silva et al. ................................. | 341/23 |
| 5,450,276 | 9/1995 | Olifant et al. ........................... | 361/152 |
| 5,543,588 | 8/1996 | Bisset et al. ............................. | 345/173 |
| 5,613,137 | 3/1997 | Bertram et al. .......................... | 395/309 |

*Primary Examiner*—Albert W. Paladini
*Attorney, Agent, or Firm*—Rosenberg, Klein & Bilker

[57] ABSTRACT

The present invention relates to an electromagnet induced switch comprises a substrate having an upper and lower conductive membranes, a plurality of electromagnet induced switches and a circuit controlling device. The electromagnet induced switches are suitably mounted onto the substrate and are suitably controlled by the circuit controlling device (including an analog multiplexer, a signal amplifying device, a signal triggering device, a signal locking-up/ deleting device, a CPU and a breaking point controlling device during operation.) By this arrangement, the depressing position can be suitably recognized and the resulted signal is suitably and properly processed by the CPU. Consequently, a quick, missing free, free of incorrect works, linear and silent inputting device is resulted.

7 Claims, 4 Drawing Sheets

ELECTROMAGNET INDUCED SWITCH

This application is a continuation-in-part of patent application Ser. No. 08/759,639 filed on Dec. 5, 1996.

FIELD OF THE INVENTION

The present invention relates to an electromagnet induced switch. The substrate is disposed with an upper and lower conductive membranes incorporated with a special electromagnet induced switch and a circuit controlling unit such that the position of a depressed key which symbolizes a certain symbol or character can be recognized. The resulted signal is further transmitted to a CPU for further processing. By this provision, a quick input, missing-proof, linear and silent input device is provided.

DESCRIPTION OF PRIOR ART

As looking the evolution of the keyswitch, the very beginning it has a mechanic On/Off type, afterward, it promotes to a true-N-key which means a depress-and-output operating is attained. On the other hand, the potential array of the keyboard has also been improved to a short-N-key wherein no-missing character, including symbol is allowed. Furthermore, during a fast inputting, no incorrect character is allowed. Besides, the inputting shall be quite, linear without breaking point.

The keyboard consisted by a plurality of keyswitch having breaking point, click sound, non-linear feeling during depressing can not be concluded as an excellent keyboard. To the keyboard consisted by true-N-key wherein each of the keyswitch is incorporated with a diode in the circuit array. The resulted depressing signal is further processed by a IC chip and an On/Off adjusting circuit. By this arrangement, the faults or phantom key can be reduced. However, each of the keyswitch shall be installed with a diode and in a standard keyboard, there are 108 keyswitches and in turn there are 108 diodes are required. This will cause the cost high. Besides, the diode is hard to anchor onto the substrate or plastic conductive membrane. In the past, only a capacitive type is allowed and which includes an upper conductive layer, a contacting layer and a lower conductive layer. However, the manufacturing process are costly and the service life is short. This three-layer configuration is sensitive to the humidity and has poor stability. Many a IC are required. This has been abandoned as cost high and poor function.

The second is an inductive type. This inductive keyswitch comprises a substrate and an magnet core wound with windings. Then the winding is expanded and penetrating through the key hole. However, this configuration needs a double sides substrate and the transformer needs a plurality of windings. A capacitor having a great capacity is required. This results a high manufacturing cost and is phased out accordingly.

Recently, a three-layer conductive membrane has been introduced such as what IBM has applied. A visual true-N-key has been formed and a soft technology has also been incorporated with the chip and controller to solve the problem. However, the missing and/or incorrect character is detected and solved by a second hidden scanning. Even this has solved the problem, the manufacturing cost and material used are still high. Besides, the keyboard made therefrom is sensitive to humidity and dust. Once the keyboard is operated under these conditions, a poor contact and phantom key will happen.

In light of this, there is still a room for providing an improved keyboard which can overcome the problem encountered by the conventional keyboard. Accordingly, a keyboard comprising a keyswitch, conductive membrane and circuit controller is provided.

There are many a prior art has been provided, for example, U.S. Pat. Nos. 4,494,109 (hereinafter referred to as '109) and 4,529,967 (hereinafter referred to as '967) have disclosed a inductive or capacitive keyboards. However, missing and losing character are still found. The manufacturing cost is also high. There is a click sound and non-linear feeling when the keyswitch is depressed.

The subject matter disclosed in '109 has a non-contact arrangement wherein a transformer and secondary sensing array signal are applied. The signal is further processed by a multiplexer and a binary/decimal converter and a binary calculator and a storing locking up circuit. This is different to the present invention.

The '967 discloses a detecting and inter-detecting principle via an integrated open circuit and encoder, analog multiplexer and voltage comparator, invertor, and microprocessor to form a N key cycle. A magnet type keyswitch and scanning controlling have been applied and this is also different with the present invention.

U.S. Pat. No. 3,698,531 has applied a solid switch wherein an alternative vibration and spring have been utilized. Different magnet sector may generate different alternative wave which can be detected accordingly. This alternative wave is sent to generate a pulse and a gate controlling SW. Then the pulse is passed to the gate circuit. The subject matter disclosed is also different to the present invention both on configuration and working principle.

U.S. Pat. No. 3,825,909 has applies a solid element comprising a magnet member and two sectional detecting crosslink. This is different to the present invention.

U.S. Pat. No. 3,740,746 has applies an inductive magnet drum and two halves and an isolating member to form a array code converting. This configuration at least comprises three-layer separating plate and an upper and lower magnetic flux area. However, this is also different to the present invention on both configuration and connection mode.

U.S. Pat. No. 4,283,714 discloses a cross array inductive keyswitch which is different to the present invention.

U.S. Pat. No. 3,651,567 discloses a non-contact interlock system wherein a intermediate crosslink path magnet collar multiplexer and a comparator are applied. This is different to the present invention.

U.S. Pat. No. 4,300,127 discloses a solid but non-contact type wherein a crosslink upper and lower magnet collars and a magnet core are applied. The switch forms a driving current generated by a fixed the primary windings.

U.S. Pat. No. 4,344,068 discloses a magnet winding and magnet spring collecting system. A magnet body and sectional magnet sectors are utilized. A array scanning, amplifier, comparator, shifter, locking and microprocessor are applied. The working voltage and current are increased by a subtractor, a solid element and line current voltage. This is also different to the present invention.

SUMMARY OF THE INVENTION

It is the objective of this invention to provide an electromagnet induced switch comprises a substrate having an upper and lower conductive membranes, a plurality of electromagnet induced switches and a circuit controlling device. The depressed key position can be readily recognized and is further transmitted to the CPU for processing. A quick input, missing free, free of incorrect character, linear and silent keyswitch is attained.

It is still the object of this invention to provide an electromagnet induced switch wherein the manufacturing cost can be greatly reduced while the formation of phantom key can be prevented.

BRIEF DESCRIPTION OF THE DRAWINGS

In order that the present invention may more readily be understood the following description is given, merely by way of example with reference to the accompanying drawings, in which.

Figure 1:
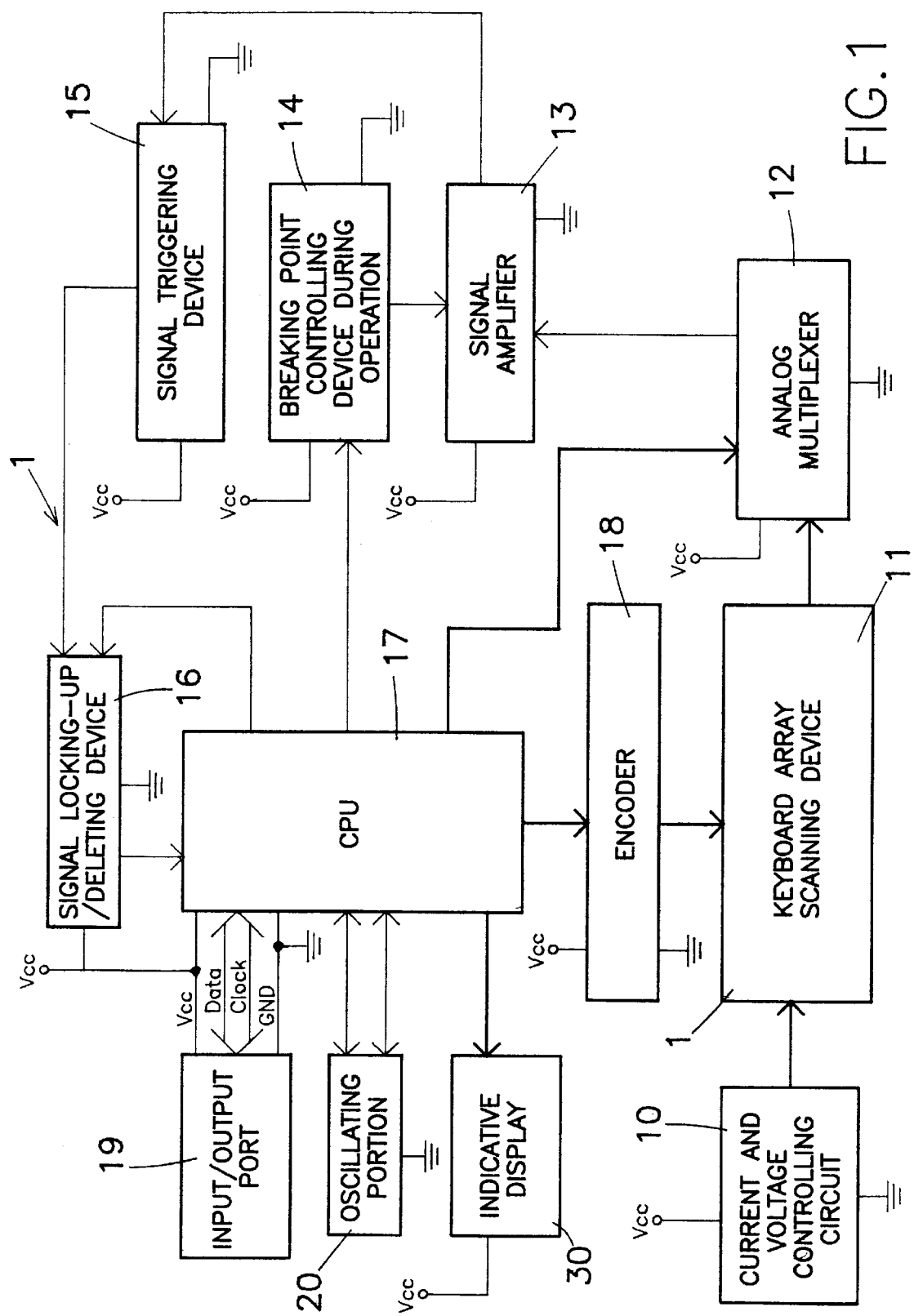
FIG. 1 is a block diagram of the circuitry used in the present invention.
Figure 2:
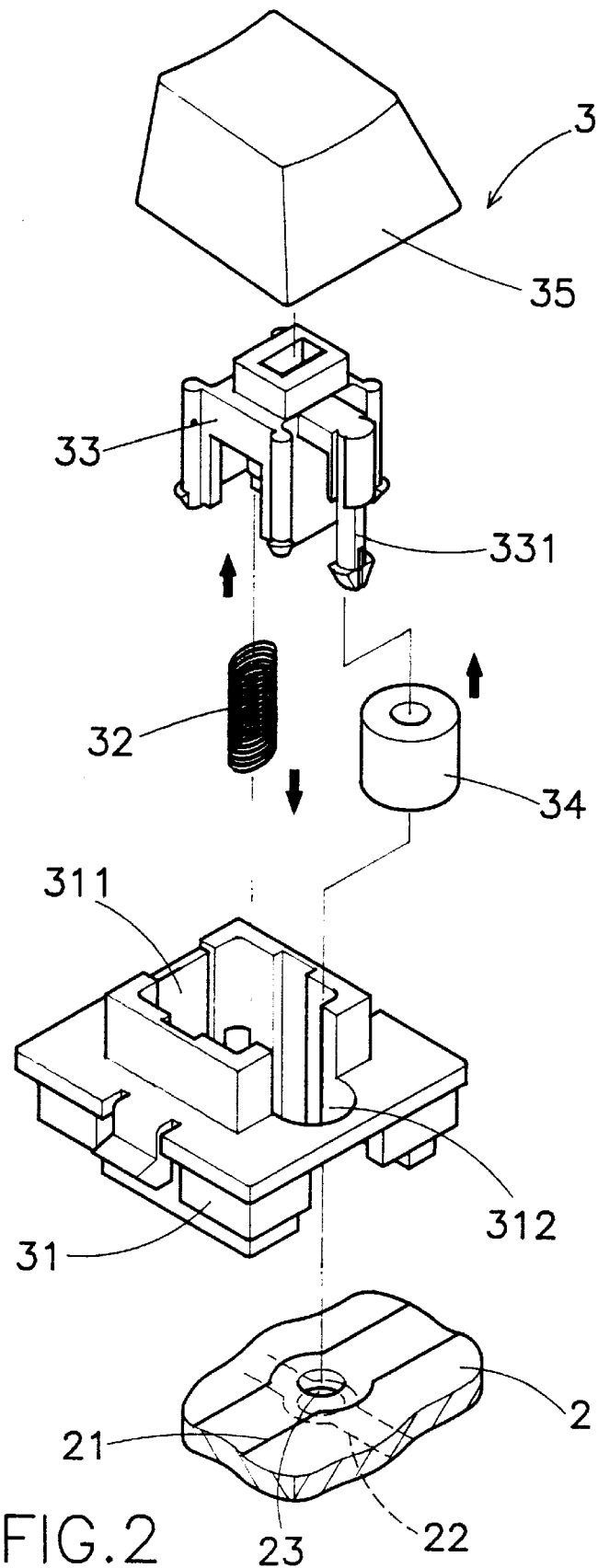
FIG. 2 is an exploded perspective view of the electromagnet induced switch made according to the present invention.

| Brief Description of Numerals | |
|---|---|
| 1 | circuit controlling unit |
| 10 | current and voltage controlling circuit |
| 12 | analog multiplexer |
| 14 | breaking point controlling device during operation |
| 16 | signal locking-up/deleting device |
| 18 | encoder |
| 20 | oscillating portion |
| 2 | substrate |
| 21 | upper conductive membrane |
| 212 | upper conductive lines |
| 22 | lower conductive membrane |
| 222 | lower conductive lines |
| 23 | through hole |
| 3 | electromagnet induced switch |
| 31 | key socket |
| 311 | receiving space |
| 312 | receiving slot |
| 32 | spring |
| 11 | keyboard array scanning device |
| 13 | signal amplifier |
| 15 | signal triggering device |
| 17 | central processing unit (CPU) |
| 19 | input/output port |
| 21 | indicative display |
| 211 | conductive lines (scanning lines) |
| 221 | conductive lines (returning lines) |
| 30 | inductive display |
| 33 | key stem |
| 331 | plunger |
| 34 | magnet core |
| 35 | key top |

DETAILED DESCRIPTION OF PREFERRED EMBODIMENT

Referring to FIGS. 1 to 4, the electromagnet induced switch generally comprises a circuit controlling circuit 1, a substrate 2, and a plurality of electromagnet induced switches 3.

The electromagnet induced switches 3 are, disposed within the keyboard array scanning device 11. The scanning procedure performed by the scanning device 11 is a multiple scanning while not a single scanning. Each of the electromagnet induced switches 3 includes a key socket 31. a coil spring 32, a key stem 33, a magnet core 34 and a key top 35. The key socket 31 is provided with a receiving space 331 wherein the coil spring 32 and the key stem 33 can be received therein. A receiving slot 312 is disposed at side of the receiving space 331 for receiving a magnet core 34 therein. A key top 35 can be disposed on the key stem 33. One side of the key stem 33 is provided with a plunger 331 for mounting the magnet core 34 thereon.

When the electromagnet switch 3 is depressed, the magnet core 34 may pass through a substrate 2 having mounted thereof an upper conductive membrane and a lower conductive membrane such that an induced current can be detected at the lower conductive membrane 22 according to the amperage rule.

The substrate 2 is disposed under the electromagnet induced switch 3. In the position of the substrate 2 corresponding to the magnet core 34, a through hole 23 is provided. In the area around to the through hole 23, an upper and lower conductive membranes 21, 22 having a plurality of concentric rings disposed around to the through hole 23 are disposed at the substrate 2. The concentric rings are coaxial with the through hole 23. The upper and lower conductive membranes 21 and 22 are perpendicular to each other. Once the key top is depressed, the magnet core 34 may pass through the through hole 23 such that an induced current is generated. The upper conductive membrane 21 is electrically connected to an encoder 18 by means of a scanning line 211 and the lower conductive membrane 22 is electrically connected to a multiplexer 12 by means of a returning line 221. The upper and lower conductive membranes 21 and 22 are electrically connected to a current and voltage controlling circuit 10 to enhance the detecting capability to the induced current generated by the electromagnet induced switch 3.

When there is a variation of current on the scanning line 211, a magnetic flux will be generated at the external space and this magnet flux will be cut by the magnet core 34 of the electromagnet induced switch 3 such that an electromagnet is formed. Accordingly, an induced current is detected from the returning line 221.

Figure 3:
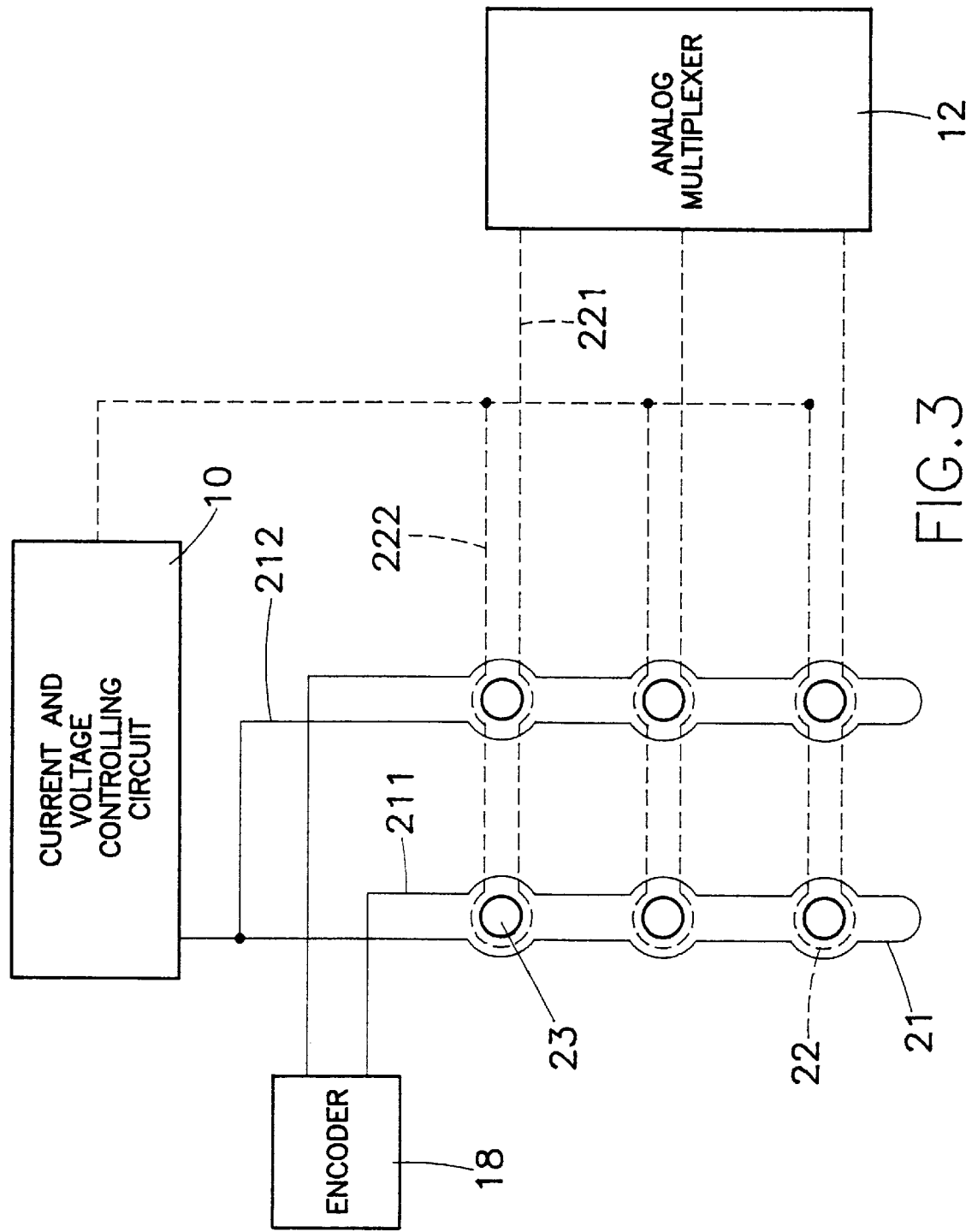
FIG. 3 is a schematic illustration showing the electrical connection between the substrate and an external circuit.
Figure 4:
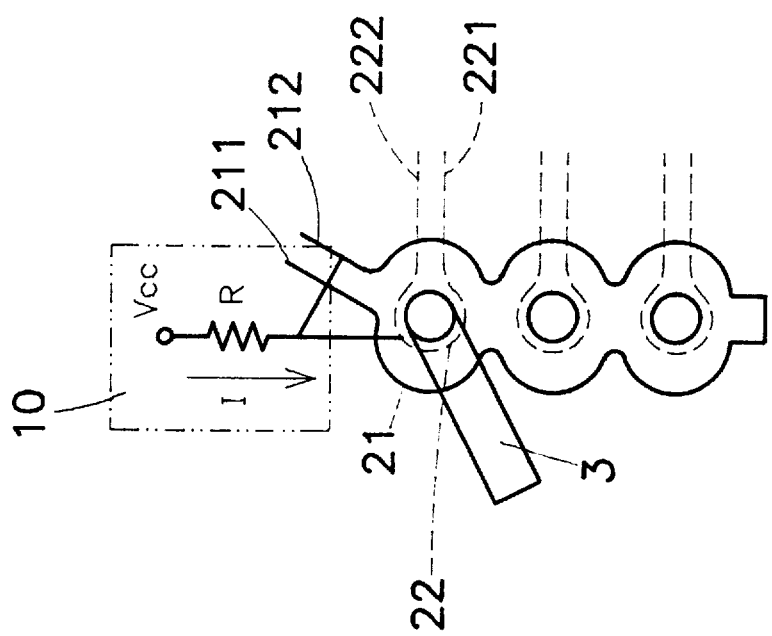
FIG. 4 is a schematic illustration showing the electromagnet induced switch is mounted onto the substrate.

Referring to FIGS. 1 and 3, the scanning line 211 of the upper conductive membrane 21 is electrically connected to the CPIJ 17 by means of a encoder 18. The returning line 221 of the lower conductive membrane 22 is electrically connected to the CPU 17 by means of an analog multiplexer 12. The multiplexer 12 receives the controlling signal sent from the CPU 17, consequently, the induced electrical signal generated by the electromagnet induced switch 3 can be used for multi-functional applications.

The signal amplifying device 13 is connected to the output port of the analog multiplexer 12. The signal from the multiplexer 12 can be amplified by the signal amplifying device 13 for enhancing the intensity of the signal.

The signal triggering device 15 is connected to the output port of the signal amplifying device 13 to receive the signal from the signal amplifying device 13 and establish an upper and lower threshold for accuracy. Accordingly, the signal detected can be categorized to a high or lower level.

The signal locking-up/deleting device 16 is electrically connected to the output port of the signal triggering device 15 and the output port of the signal locking-up/deleting device 16 is in turn electrically connected to the CPU 17. The output signal from the signal triggering device 15 is firstly sent to the signal locking-up/deleting device 16, then to the CPU 17 for further processing, such as locking up or deleting.

The breaking point controlling device during operation 14 is electrically connected to the signal amplifying device 13 and also to the CUP 17. The breaking point controlling device during operation 14 receives the controlling signal from the CPU 17 to get an upper or a lower limits for correcting the triggering position.

On the other hand, the CPU 17 is also electrically connected with the input/output connecting portion 19, an oscillating device 20 and an indicating display 30.

By this provision, the uncertain On/Off triggering resulted from different depressing force exerted from fingers can be suitably corrected and modified. Furthermore, the missing of input can also be greatly improved. The linear is upgraded to silent. The incorrect input can be therefore avoided.

The electromagnet induced switch can be concluded with the following advantages:

1. Free from missing or incorrect input of character.
2. Linear and excellent touch feeling.
3. The upper and lower limits of On/Off of a keyboard can be readily adjusted.
4. Quiet and silent.
5. Free of loss.
6. Quick inputting of characters.

While particular embodiment of the present invention has been illustrated and described, it would be obvious to those skilled in the art that various other changes and modifications can be made without departing from the spirit and scope of the invention. It is therefore intended to cover in the appended claims all such changes and modifications that are within the scope of the present invention.

I claim:

1. A keyboard system, comprising
   a keyboard array scanning device having
   a plurality of electromagnet induced switches mounted thereon, each of said electromagnet induced switches including a magnet core,
   a substrate having a plurality of through holes, each through hole corresponding to a magnetic core,
   first conductive membranes disposed on a first surface of the substrate,
   second conductive membranes disposed on a second surface of the substrate opposite the first surface,
   a scanning line electrically connected to each first conductive membrane, and
   a return line electrically connected to each second conductive membrane,
   each first and second conductive membrane being positioned relative to a through hole such that, when a current in a first membrane adjacent to a through hole is varied while an electromagnet induced switch is depressed to thereby cause the corresponding magnet core to move down through said through hole, a current is induced in a second conductive membrane adjacent said through hole;
   an encoder electrically connected to the scanning line;
   a current and voltage controlling device electrically connected to each of the first and second conductive membranes to enhance the sensitivity of the keyboard system to current induced in a second conductive membrane;
   a CPU electrically connected to the input port of said encoder;
   an analog multiplexer electrically connected to said returning line and said CPU;
   a signal amplifying device electrically connected to an output port of said analog multiplexer, to amplify the signal from said multiplexer;
   a signal triggering device electrically connected to an output port of said signal amplifying device to receive a signal from said signal amplifying device and establish an upper and lower threshold for accuracy of the signal, so that the signal from said signal amplifying device can be categorized at a high or low level; and
   a breaking point controlling device electrically connected to said signal amplifying device and also to said CPU, wherein said breaking point controlling device during operation receives the controlling signal from said CPU to obtain upper or a lower limits for correcting the triggering position.

2. A keyboard system as recited in claim 1, wherein each of said first and second conductive membranes form a concentric rings around adjacent through holes in said substrate.

3. A keyboard system as recited in claim 1, wherein a conducting line of either said first or second conductive membrane is connected to said current and voltage controlling device.

4. A keyboard system as recited in claim 1, wherein said first conductive membranes are arranged perpendicular to the second conductive membranes.

5. A keyboard system as recited in claim 1, wherein each electromagnet induced switch includes a key stem having a plunger thereon, said magnet core being attached to said plunger.

6. A keyboard system as recited in claim 1, wherein a scanning process performed on said keyboard array scanning device is a multiple scanning.

7. A keyboard system as recited in claim 2, wherein said first conductive membranes are arranged perpendicular to the second conductive membranes.

* * * * *